United States Patent [19]

Matsumura et al.

[11] Patent Number: 4,787,007
[45] Date of Patent: Nov. 22, 1988

[54] OUTPUT DRIVER CIRCUIT

[75] Inventors: Ken Matsumura, Odawara; Hideharu Tezuka, Yokosuka, both of Japan

[73] Assignee: Kabushiki Kaisha Toshiba, Kawasaki, Japan

[21] Appl. No.: 24,672

[22] Filed: Mar. 11, 1987

[30] Foreign Application Priority Data

Mar. 31, 1986 [JP] Japan .................................. 61-72903

[51] Int. Cl.⁴ ........................ H02H 3/093; H02H 5/04
[52] U.S. Cl. ..................................... 361/98; 361/101; 361/103; 361/91; 323/278; 323/285; 307/475
[58] Field of Search .................... 361/18, 91, 93, 94, 361/98, 100, 101, 103, 88, 89, 90, 92; 323/273, 274, 275, 276, 277, 278, 280, 281, 314, 289; 307/254, 475

[56] References Cited

U.S. PATENT DOCUMENTS 3,959,713  5/1976  Davis et al. .................... 361/103 X
4,438,473  3/1984  Cowley et al. ...................... 361/18
4,528,608  7/1985  Anderson et al. ................... 361/94
4,555,742  11/1985  Gray et al. ...................... 361/98 X Primary Examiner—A. D. Pellinen
Assistant Examiner—H. L. Williams
Attorney, Agent, or Firm—Finnegan, Henderson, Farabow, Garrett, & Dunner

[57] ABSTRACT

In an output driver semiconductor circuit, a protection circuit is used to protect the output NPN transistor from being destroyed. The protection circuit comprises an excessive current detector for detecting an excessive collector current of the output NPN transistor, an excessive temperature detector for detecting an excessive temperature of the output transistor, and an OR gate for taking a logical sum of output signals of the detectors. According to the output signal of the OR gate, a base current of the control NPN transistor is controlled, so that a base current of the output transistor is kept below a predetermined value.

3 Claims, 4 Drawing Sheets

F I G. 1
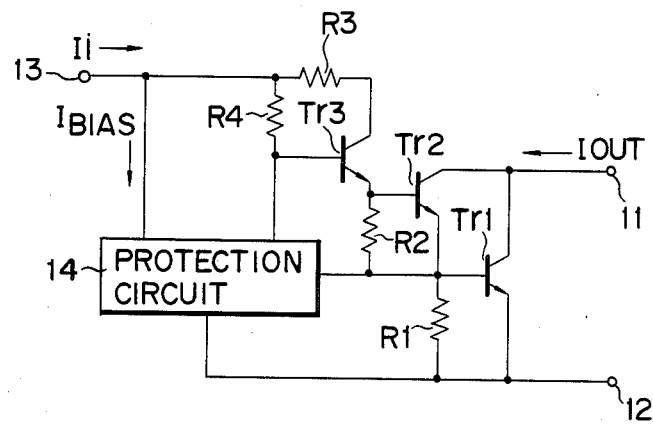
F I G. 2
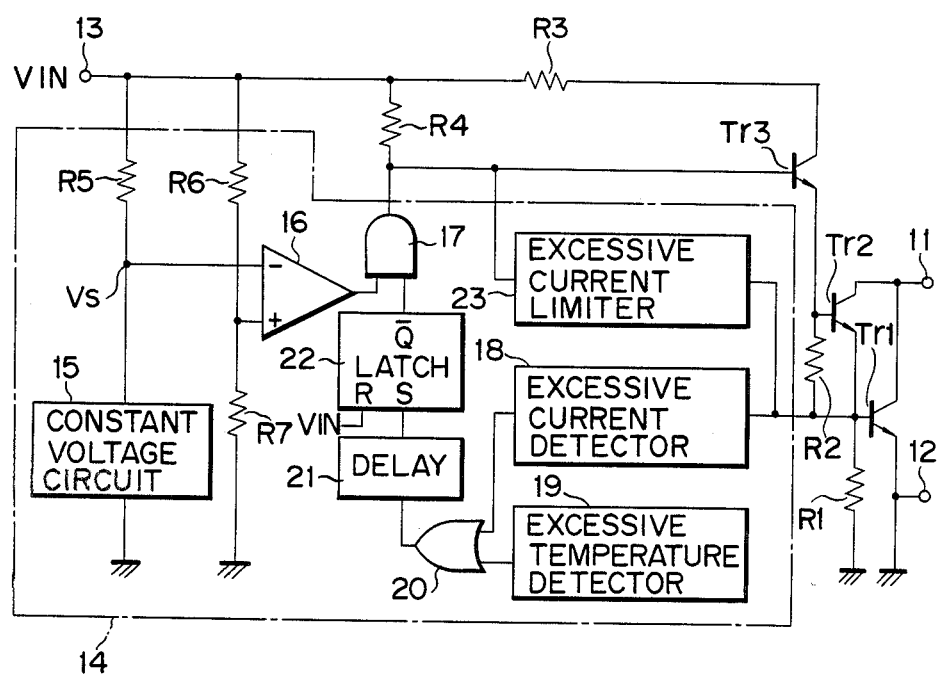

OUTPUT DRIVER CIRCUIT

BACKGROUND OF THE INVENTION

The present invention relates to a bipolar integrated circuit and, more particularly, to an output driver circuit used as an interface driver and the like.

In general, a single NPN transistor is employed as an output driver circuit used as an interface driver and the like. However, the use of a single NPN transistor entails the risk that if the collector and a power source are short-circuited, a large current exceeding the maximum value in the safe operating range begins to flow between the collector and emitter resulting in transistor break down. In such an abnormal condition, there is also the danger that the transistor will generate increased heat and that its temperature will exceed the safe junction temperature, again resulting in the transistor breaking down.

Accordingly, an output driver circuit using a single NPN transistor possesses the drawback wherein it is easily rendered inoperative by an excessive output current or by excessive temperature.

SUMMARY OF THE INVENTION

It is therefore an object of the present invention to provide an output driver circuit of three terminals which can be prevented from the breaking down, due to an excessive output current and excessive temperature.

An output driver circuit according to the present invention comprises: an output NPN transistor whose collector and emitter are respectively connected to first and second terminals; a control NPN transistor whose emitter is connected to the base of the output NPN transistor, and whose base and collector are connected to a third terminal; and a protection circuit for detecting a collector current to the output NPN transistor and controlling a base current to the control NPN transistor.

The operation of the present invention will now be explained briefly.

When the collector current to the output NPN transistor becomes an excessive value, supply of the base current to the control NPN transistor is shut off by the protection circuit so that the output NPN transistor is protected.

BRIEF DESCRIPTION OF THE DRAWINGS

FIG. 1 is a diagram showing the basic structure of an output driver circuit according to an embodiment of the present invention;

FIG. 2 is a circuit diagram of the driver circuit shown in FIG. 1 and, in particular, shows a protection circuit, as a block diagram;

DETAILED DESCRIPTION OF THE PREFERRED EMBODIMENT

Figure 3:
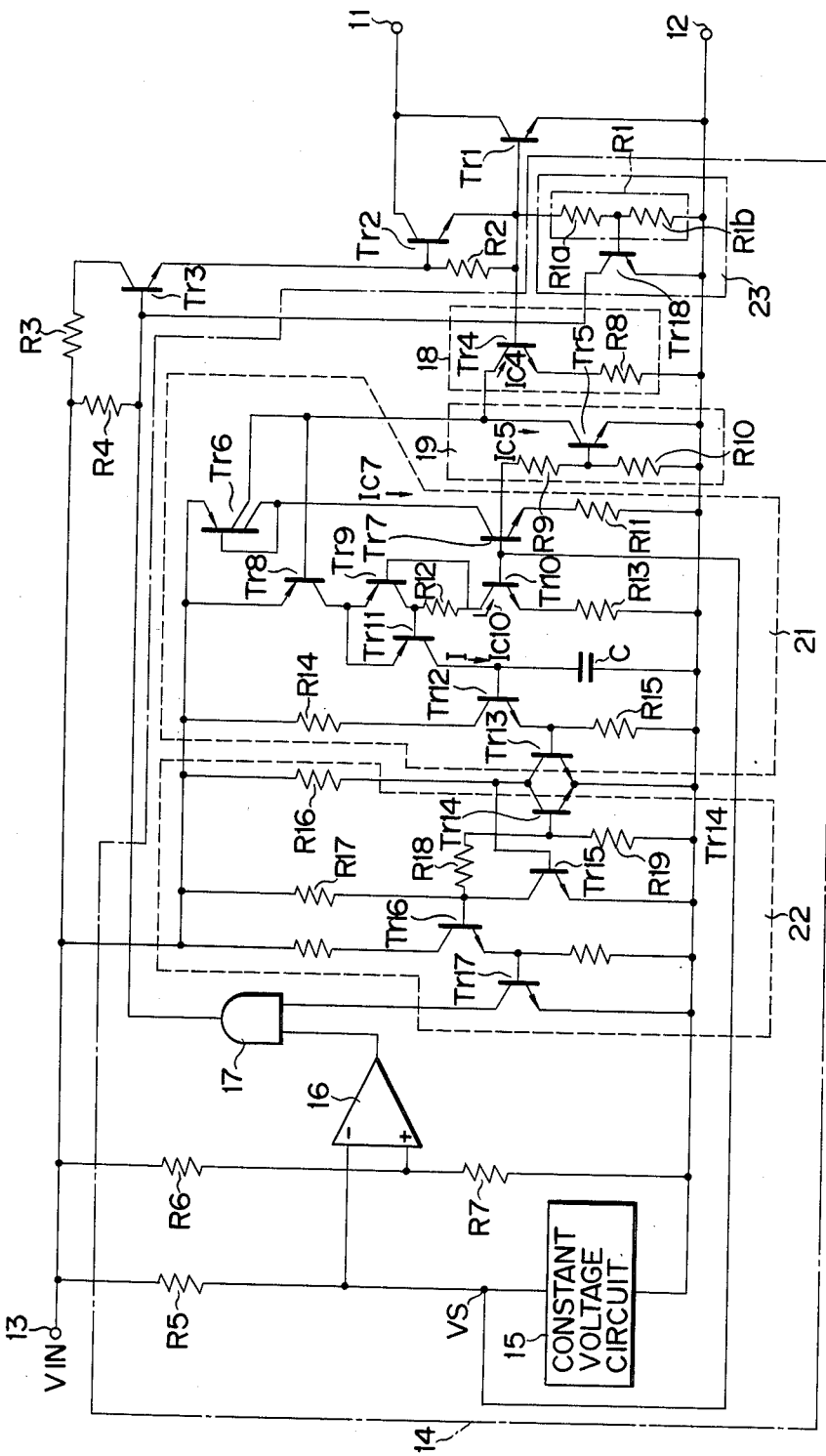
FIG. 3 is a circuit diagram of the driver circuit shown in FIG. 1 and shows the protection circuit in further detail.

An embodiment of the present invention will now be described hereinbelow, with reference to the drawings.

The collector and emitter of an output NPN transistor $Tr_1$ are respectively connected to first and second terminals 11 and 12 shown in FIG. 1. The emitter and collector of an NPN transistor $Tr_2$ are respectively connected to the base and collector of output transistor $Tr_1$. A resistor $R_1$, for absorbing a leakage current and increasing the operation speed, is connected between the base and emitter of transistor $Tr_1$, in order to prevent a malfunction. The emitter of a control NPN transistor $Tr_3$ is connected to the base of transistor $Tr_2$. A resistor $R_2$, for absorbing a leakage current and increasing the operation speed, is connected between the base and emitter of transistor $Tr_2$, in order to prevent a malfunction.

A third terminal 13 is connected to the collector of control NPN transistor $Tr_3$, via a resistor $R_3$ for limiting a bias current to transistor $Tr_1$. Third terminal 13 is connected to the base of transistor $Tr_3$, via a bias resistor $R_4$. A protection circuit 14 is also connected to the base of transistor $Tr_3$. The base and emitter of output NPN transistor $Tr_1$ and third terminal 13 are all connected to protection circuit 14.

In the foregoing construction, when an input current $I_i$ is supplied to third terminal (input terminal) 13, control NPN transistor $Tr_3$ is turned on, and darlington-connected transistors $Tr_2$ and $Tr_1$ are sequentially turned on. Now, assuming that current-amplification factors of transistors $Tr_2$ and $Tr_1$ are $h_{FE2}$ and $h_{FE1}$, respectively, and that a bias current of protection circuit 14 is $I_{BIAS}$, an output current $I_{out}$ will become ps
$$I_{out} = (I_i - I_{BIAS}) h_{FE2} \cdot h_{FE1} \quad (1)$$

Further, a current-amplification factor $h_{FE} (= h_{FE2} \times h_{FE1})$ of the transistor circuit composed of transistors $T_{r2}$ and $T_{r1}$ is expressed as follows.

$$h_{FE} \simeq \frac{I_{out}}{I_i - I_{BIAS}} \quad (2)$$

FIG. 2 shows the circuit of FIG. 1 and illustrates a structure of protection circuit 14, as a block diagram. In FIG. 2, the same parts and elements as those shown in FIG. 1 are designated by the same reference numerals, and thus, their detailed descriptions are omitted.

The structure of protection circuit 14 will be first described.

One end of a resistor $R_5$ is connected to third terminal 13. A constant-voltage circuit 15 of band-gap type is arranged between the other end of resistor $R_5$ and the ground. An inverting input terminal (−) of a comparator 16 is connected to an output terminal of constant-voltage circuit 15, i.e., to a node between resistor $R_5$ and constant voltage circuit 15. A node of resistors $R_6$ and $R_7$ is connected to a non-inverting input terminal (+) of comparator 16. Resistors $R_6$ and $R_7$ are serially connected between third terminal 13 and the ground. Resistor $R_6$ is arranged on the side of third terminal 13. Resistor $R_7$ is arranged on the ground side. An output terminal of comparator 16 is connected to one input terminal of a two-input AND gate 17.

An input terminal of an excessive current-detection circuit 18 is connected to the base of output NPN transistor $Tr_l$. An output terminal of detection circuit 18 is connected to one input terminal of a two-input OR gate 20. The other input terminal of OR gate 20 is connected to an output terminal of an excessive temperature-detection circuit 19. An output terminal of OR gate 20 is connected to an input terminal of a delay circuit 21. The output signal of OR gate 20 is delayed by delay circuit 21. An output terminal of delay circuit 21 is connected to a set input terminal S of a latch circuit 22. The output signal of delay circuit 21 is latched by latch circuit 22. An output terminal $\overline{Q}$ of latch circuit 22 is connected to the other input terminal of two-input AND gate 17. An output terminal of AND gate 17 is connected to the base of control NPN transistor $Tr_3$. The AND (logical product) output signal of AND gate 17 is supplied to the base of control NPN transistor $Tr_3$. An excessive current limiter 23 is arranged between the base of control NPN transistor $Tr_3$ and the base of output NPN transistor $Tr_l$. The limiter 23 limits the base current of control NPN transistor $Tr_3$, thereby suppressing a base current, flowing through transistor $Tr_l$, to a value below a desired value.

The operation as a driver circuit in the foregoing constitution will now be described.

When an input voltage $V_{in}$ is applied to third terminal 13, an output terminal voltage $V_s$ of constant-voltage circuit 15 is applied to the inverting input terminal (−) of comparator 16, and a voltage of $$\frac{R_7}{R_6 + R_7} \cdot V_{in},$$

which is derived by dividing input voltage $V_{in}$ by resistors $R_6$ and $R_7$, is applied to the non-inverting input terminal (+).

When $$V_s > \frac{R_7}{R_6 + R_7} \cdot V_{in}, \quad (3)$$

the output of comparator 16 becomes "L" level and the output of AND gate 17 also becomes "L" level. Therefore, no bias current flows through the base of control NPN transistor $Tr_3$, and each of transistors $Tr_3$, $Tr_2$, and $Tr_l$ is turned off.

On the other hand, when $$V_s < \frac{R_7}{R_6 + R_7} \cdot V_{in}, \quad (4)$$

the output of comparator 16 becomes "H" level. The output of latch circuit 22 becomes "H" level, in the normal operation of output transistor $Tr_l$, and becomes "L" level in the abnormal condition thereof. In normal operation, both of two inputs of AND gate 17 become "H" level, and the output of AND gate 17 becomes "H" level. Therefore, the base of control NPN transistor $Tr_3$ is biased via resistor $R_4$, by input voltage $V_{in}$, so that transistor $Tr_3$ is turned on. Thus, transistors $Tr_2$ and $Tr_l$ are sequentially turned on.

A threshold voltage $V_{TH}$ of this integrated circuit becomes as follows from expressions (3) and (4):

$$V_{TH} = \left( \frac{R_6 + R_7}{R_7} \right) \times V_s \quad (5)$$

However, when comparator 16 and resistors $R_6$ and $R_7$ are not provided (the circuit also operates even if they are not provided), threshold voltage $V_{TH}$ of the circuit becomes the sum of each voltage $V_{BE}$ of transistors $Tr_3$ to $Tr_1$, i.e., $3V_{BE}$. Therefore, threshold voltage $V_{TH}$ of expression (5) needs to be set to a value higher than $3V_{BE}$.

Since constant voltage circuit 15 is of the bandgap type, threshold voltage $V_{TH}$ does not depend on the ambient temperature.

The protecting operation performed in the event that output NPN transistor $Tr_1$ experiences an abnormal condition, will now be described.

It is now assumed that the load (not shown) connected to first terminal 11 of transistor $Tr_1$, for example, was short-circuited, so that a collector current to NPN transistor $Tr_1$ has increased. In this case, the abnormal state (excessive current) is detected by excessive current-detector 18, and the output signal of detector 18 becomes "H" level.

Alternatively, assuming that the temperature of the chip has greatly increased due to the abnormal operation of transistor $Tr_1$, this abnormal state (excessive temperature) is detected by excessive temperature-detector 19, and the output of detector 19 becomes "H" level. When at least one of the output signals of excessive current-detector 18 and excessive temperature-detector 19 becomes "H" level, the output signal of OR gate 20 becomes "H" level. The output signal of OR gate 20 is supplied to delay circuit 21. After the output of an "H" level signal from OR gate 20, when a predetermined time has elapsed, the output signal of delay circuit 21 becomes "H" level and latch circuit 22 is set. Thus, the $\overline{Q}$ output signal of latch circuit 22 becomes "L" level, so that the output signal of AND gate 17 becomes "L" level, irrespective of the level of the output signal of comparator 16. Transistors $Tr_3$, $Tr_2$, and $Tr_1$ are sequentially turned off and the abnormal state brought about by the excessive current or excessive voltage is eliminated. Therefore, no current flows through transistors $Tr_3$ to $Tr_1$, so that transistors $Tr_3$ to $Tr_1$ do not break down.

The reason why control NPN transistor $Tr_3$ is turned off, after the elapse of a predetermined time period, by using delay circuit 21, following output of the "H" level signal was from OR gate 20, is to prevent protection circuit 14 from responding to the instantaneous increase in the base current of output NPN transistor $Tr_1$, which is caused by external noise and the like. In order to set output NPN transistor $Tr_1$ into the safe operating range, within the delay time, by means of delay circuit 21, excessive current-limiter 23 operates to restrict the base current of control NPN transistor $Tr_3$. Namely, limiter 23 limits the base current of control NPN transistor $Tr_3$, thereby suppressing the base current of output NPN transistor $Tr_1$. When the abnormal state is eliminated and the normal state is restored, latch circuit 22 is reset by the following high level pulse of input voltage $V_{in}$. As the result, the output signal of AND gate 17 becomes "H" level and transistors $Tr_3$ to $Tr_1$ are again turned on, so that the current starts flowing again.

According to the foregoing structure, abnormal conditions such as excessive output current, excessive temperature, and the like, of the output transistor, can be eliminated, so that the breaking down of the output transistor can be prevented. Moreover, since the entire circuit has three terminals, it can be used as an output driver circuit composed of a single NPN transistor, without being modified.

FIG. 3 shows the circuit of FIG. 1 and, in particular, illustrates a structure of protection circuit 14 in greater detail than in FIG. 2. Since constant-voltage circuit 15 and comparator 16 are well-known circuits, they are represented simply by a block and a symbol, and thus, the detailed structures thereof are omitted here. In FIG. 3, the same parts and elements as shown in FIGS. 1 and 2 are designated by the same reference numerals, and will be explained in detail hereinafter.

Excessive current-detector 18 is comprised of an NPN transistor $Tr_4$ and a resistor $R_8$. A detection current $I_{c4}$ is set by a voltage $V_{BE1}$ across the base and emitter of output NPN transistor $Tr_1$. Detection current $I_{c4}$ is represented by expression (6).

$$I_{c4} = \frac{V_{BE1} - V_{BE4}}{R_8} \quad (6)$$

Excessive temperature-detector 19 is composed of an NPN transistor $Tr_5$ and resistors $R_9$ and $R_{10}$, and is made operative by an output voltage $V_s$ of constant-voltage circuit 15. A voltage $VBE5$ across the base and emitter of transistor $Tr_5$ is expressed as follows:

$$V_{BE5} = \left(\frac{R_{10}}{R_9 + R_{10}}\right) V_s \quad (7)$$

An increase in ambient temperature is detected by use of a temperature coefficient (nearly $-2$ mV/°C.) of voltage $V_{BE5}$.

Delay circuit 21 comprises: a PNP transistor $Tr_6$ of multicollectors as a current mirror circuit; and NPN transistors $Tr_7$, $Tr_{10}$, $Tr_{12}$, and $Tr_{13}$; PNP transistors $Tr_8$, $Tr_9$, and $Tr_{11}$; resistors $R_{11}$ to $R_{15}$; and a capacitor C.

PNP transistor $Tr_6$ has two collectors. One of the collectors is connected to the base of the transistor and the collector of transistor $Tr_7$ and constitutes an input terminal of the current mirror circuit. The other collector is connected to the collectors of transistors $Tr_4$ and $Tr_5$ and the base of transistor $Tr_8$ and constitutes an output terminal of the current mirror circuit. The emitter of transistor $Tr_6$ is connected to third terminal 13.

The operation of delay circuit 21 will now be explained.

A collector current $I_{c7}$ of transistor $Tr_7$ becomes a reference current for the excessive output current and excessive temperature detection current. Collector current $I_{c7}$ is expressed by the following expression (8). A current having a value substantially the same as that of current $I_{c7}$ flows to a junction of the base of transistor $Tr_8$ and the collectors of transistors $Tr_4$ and $Tr_5$, from PNP transistor $Tr_6$.

$$I_{c7} = \frac{V_s - V_{BE7}}{R_{11}} \quad (8)$$

Now assuming that collector currents of NPN transistors $Tr_4$ and $Tr_5$ are $I_{c4}$ and $I_{c5}$, respectively. Transistor $Tr_8$ is turned off under the condition where $I_{c7}$ is larger than $I_{c4}$, or where $I_{c7}$ is larger than $I_{c5}$, so that delay circuit 21 does not operate. Transistor $Tr_8$ is turned on under the condition where $I_{c7} < I_{c4}$ or $I_{c7} < I_{c5}$, so that capacitor C is charged by a small current I determined by transistors $Tr_9$ to $Tr_{11}$ and resistors $R_{12}$ and $R_{13}$. When the charged potential in capacitor C reaches a predetermined level, transistors $Tr_{12}$ and $Tr_{13}$ are sequentially turned on. Thus, latch circuit 22 operates.

Small current I to capacitor C is obtained in the following manner:

A collector current $I_{c10}$ to transistor $Tr_{10}$ is $$I_{c10} = \frac{V_s - V_{BE10}}{R_{13}} \quad (9)$$

In addition, assuming that the voltage across the base and emitter of transistor $Tr_{11}$ is $V_{BE11}$, and that resistance value of resistor $R_{12}$ is $R_{12}$, a voltage $VBE9$ across the base and emitter of transistor $Tr_9$ will be $$V_{BE9} = I_{c10} \times R_{12} + V_{BE11} \quad (10)$$

Therefore, small current I can be obtained by $$I = \frac{I_{c10}}{\exp\frac{q}{kT} I_{c10} \cdot R_{12}} \quad (11)$$

q denotes the charge of electron, k denotes the Boltzman constant and T denotes an absolute temperature. In addition, delay time T is expressed by $$T = \frac{C \times (V_{BE12} + V_{BE13})}{I} \text{ (sec)} \quad (12)$$

Latch circuit 22 comprises NPN transistors $Tr_{14}$, $Tr_{15}$, $Tr_{16}$ and $Tr_{17}$ and resistors $R_{16}$ to $R_{19}$. Resistors $R_{18}$ and $R_{19}$ serve to reset the latch circuit, by means of a high level pulse of an input signal voltage $V_{in}$. When input signal voltage $V_{in}$ is input, transistor $Tr_{15}$ is turned on and transistor $Tr_{14}$ is turned off.

NPN transistor $Tr_{16}$ is emitter-follower connected, and drives NPN transistor $Tr_{17}$. In the reset state of latch circuit 22, transistors $Tr_{16}$ and $Tr_{17}$ are turned off. On the other hand, when transistors $Tr_{11}$ and $Tr_{12}$ in delay circuit 21 are ON, transistor $Tr_{15}$ is turned off. Thus, since transistors $Tr_{16}$ and $Tr_{17}$ are turned on, the output signal of AND gate 17 becomes "L" level, and transistors $Tr_3$, $Tr_2$, and Trare sequentially turned off.

Excessive current limiter 23 composed of an NPN transistor $Tr_{18}$ and a resistor $R_l$ ($R_{1a}$, $R_{1b}$). Transistor $Tr_{18}$ is made operative by the voltage obtained by dividing voltage $V_{BE1}$ across the base and emitter of output NPN transistor $Tr_1$, by resistors $R_{1a}$ and $R_{1b}$. Assuming that resistance values of resistors $R_{1a}$ and $R_{1b}$ are respectively $R_{1a}$ and $R_{1b}$, operating voltage $V_{BE18}$ is expressed by the following expression (13):

$$V_{BE18} = \frac{R_{1b}}{R_{1a} + R_{1b}} \times V_{BE1} \quad (13)$$

In the output semiconductor circuit, when the collector current of output transistor $Tr_1$ is increased, the base-emitter voltage thereof is increased accordingly. When the base-emitter voltage of output transistor $Tr_1$ is increased, the collector current of transistor $Tr_4$ is increased accordingly. When the collector current of output transistor $Tr_1$ is excessively increased and the collector current of transistor $Tr_4$ is also excessively increased, a base current starts to flow through transistor $Tr_8$ to turn the transistor on. When transistor $Tr_8$ is turned on, the output level of AND gate 17 changes to "L" level. Therefore, no bias current flows to the base of control transistor $Tr_3$. Consequently, transistor $Tr_3$ is turned off; and, thus, transistors Tr$_2$ and Tr$_1$ are turned off. As a result, the excessive collector current of output transistor Tr$_1$ stops flowing therethrough. Therefore, output transistor Tr$_1$ is prevented from being damaged due to the excessive collector current.

According to such a structure, excessive current-detector 18, excessive temperature-detector 19, delay circuit 21, latch circuit 22, and excessive current-limiter 23 can be realized by a relatively small number of elements.

As has been described above, according to the present invention, it is possible to obtain an output driver circuit of three terminals, which can eliminate abnormal conditions such as excessive output current and excessive temperature and the like, of the output transistor, and can prevent the breaking down of the output transistor, due to such abnormal conditions.

Figure 4:
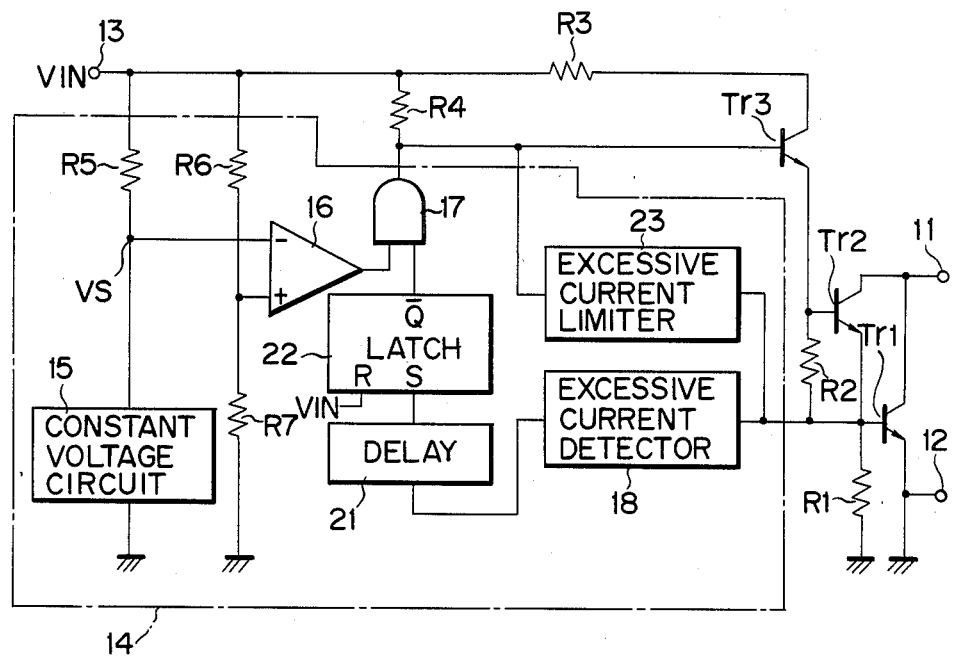
FIG. 4 is a circuit diagram of a driver circuit according to another embodiment of the present invention, and which corresponds to that shown in FIG. 2.

FIG. 4 shows an example in which excessive temperature-detector 19 has been removed. In this case, the output transistor cannot be protected from breaking down due to excessive temperature, but can be protected from a breakdown caused by excessive current. However, OR gate 20 can be omitted.

Figure 5:
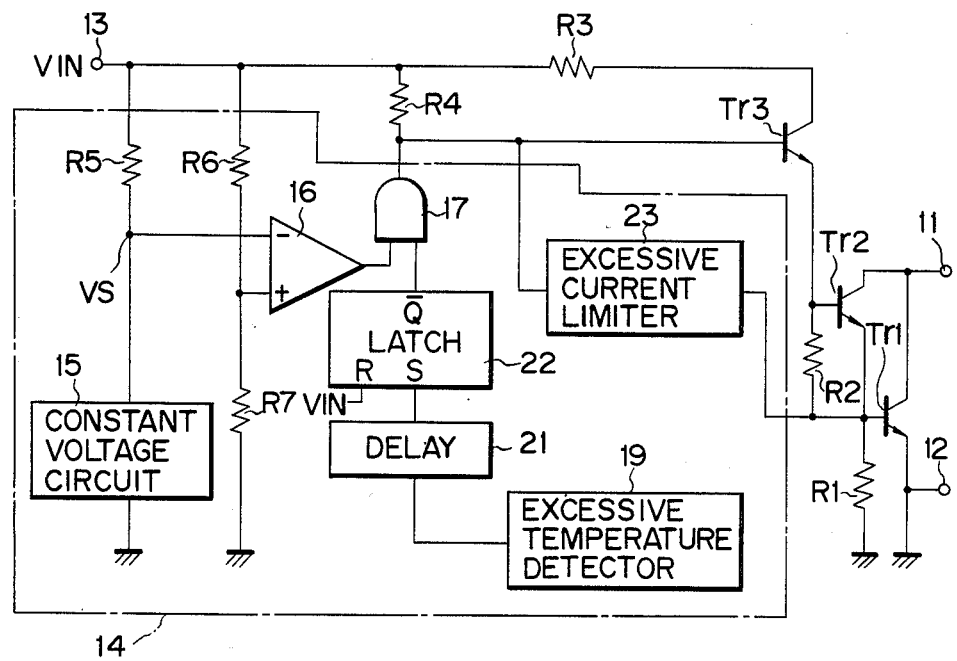
FIG. 5 is a circuit diagram of a driver circuit according to still another embodiment of the present invention, and which corresponds to that shown in FIG. 2.

FIG. 5 shows an example in which the excessive current-detector has been removed. In this case, although the output transistor cannot be protected from breaking down due to excessive current, but can be protected from a breakdown caused by excessive temperature, OR gate 20 can be omitted.

Figure 6:
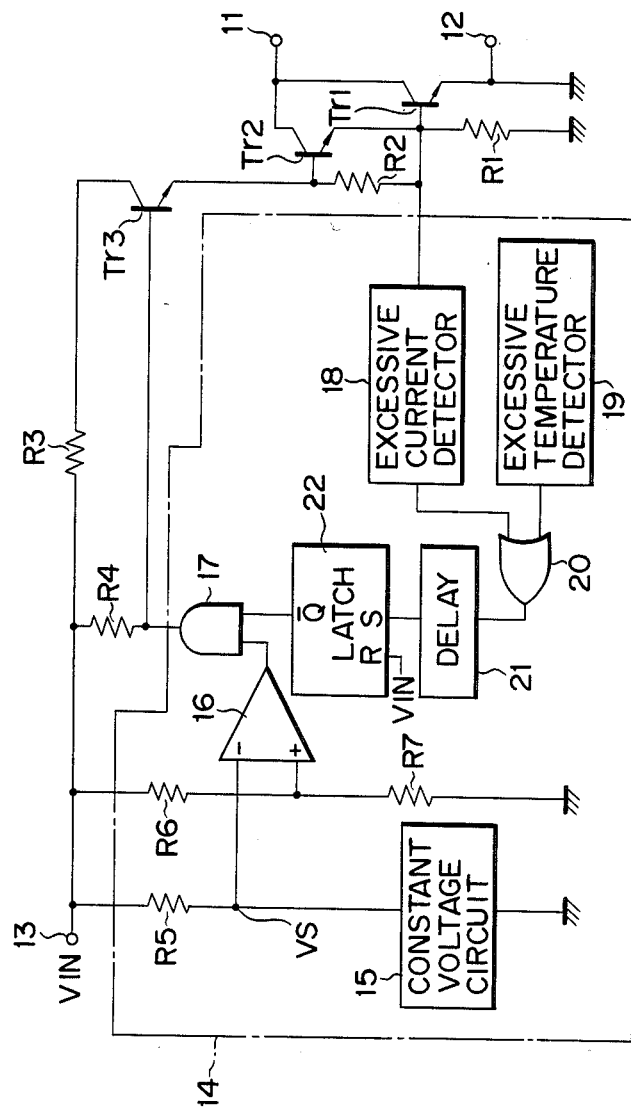
FIG. 6 is a circuit diagram of a driver circuit according to still another embodiment of the present invention, and which corresponds to that shown in FIG. 2.

FIG. 6 shows an example in which the excessive current-limiter has been removed. In this case, even if an excessive current flows, it cannot be reduced, for the constant delay time period, by delay circuit 21. However, if the excessive current is generally not so large, excessive current limiter 23 is not always necessary.

What is claimed is:

1. An output driver semiconductor circuit comprising:
   first, second, and third terminals;
   an output NPN transistor whose collector and emitter are connected to said first and second terminals, respectively;
   a control NPN transistor whose emitter is connected to the base of said output NPN transistor, and whose base and collector are operatively connected to said third terminal;
   a protection circuit, connected between the base of said output NPN transistor and the base of said control NPN transistor, for detecting a collector current of said output NPN transistor based on a base-emitter voltage thereof and for controlling a base current of said control NPN transistor to turn the control transistor on or off, the protection circuit comprising a first detection circuit for detecting an excessive collector current of said output NPN transistor, a second detection circuit for detecting an excessive temperature of said output NPN transistor, a logic circuit for providing a logical sum of output signals of said protection circuits and delaying the output of the logical sum for a predetermined time period, a latch circuit for latching an output signal of said logic circuit which is used to control the base current of said control NPN transistor, and a limit circuit for controlling the base current of said control NPN transistor, so that a base current of said output NPN transistor is reduced to a predetermined value;
   a constant-voltage circuit for generating a constant voltage;
   a comparator for comparing a constant voltage of said constant-voltage circuit and a voltage corresponding to an input voltage of said third terminal; and
   a logic gate for providing a logical product of an output signal of said comparator and an output signal of said latch circuit, the logic product beig used to control the base current of said control NPN transistor.

2. An output driver circuit according to claim 1, wherein said constant-voltage circuit is of band-gap type.

3. An output driver semiconductor circuit comprising:
   first, second, and third terminals;
   an output NPN transistor whose collector and emitter are connected to said first and second terminals, respectively;
   a control NPN transistor whose emitter is connected to the base of said output NPN transistor and whose base and collector are operatively connected to said third terminal; and
   a protection circuit connected between the base of said output NPN transistor and the base of said control NPN transistor for detecting a collector current of said output NPN transistor based on a base-emitter voltage thereof and controlling a base current of said control NPN transistor to turn the control transistor on or off, the protection circuit comprising first NPN transistor, second and third PNP transistors, fourth and fifth NPN transistors, a current mirror circuit, and a logic circuit, the base of the first transistor being connected to the base of the output transistor, the collector of the first transistor being connected to said second terminal, a reference terminal of said current mirror circuit being connected to said third terminal, the collector of the second transistor being connected to the emitter of the third transistor, the base of the second transistor being connected to said output terminal of the current mirror circuit, the collector of the third transistor being connected to the base thereof and to the collector of the fourth transistor, the emitter of the fourth transistor being connected to said second terminal, the base of the fourth transistor being connected to the base of the fifth transistor, the collector of the fifth transistor being connected to an input terminal of said current mirror circuit, the emitter of the fifth transistor being connected to said second terminal, and said logic circuit producing a logic signal of a logic level determined on the basis of whether or not said second transistor is turned on or off, and supplying the logic signal to the base of said control transistor to control the base current thereof.

* * * * *